(12) United States Patent
Lin et al.

(10) Patent No.: US 10,199,485 B2
(45) Date of Patent: Feb. 5, 2019

(54) SEMICONDUCTOR DEVICE INCLUDING QUANTUM WIRES

(71) Applicant: UNITED MICROELECTRONICS CORP., Hsin-Chu (TW)

(72) Inventors: Yu-Ying Lin, Tainan (TW); Chueh-Yang Liu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 97 days.

(21) Appl. No.: 15/409,467

(22) Filed: Jan. 18, 2017

(65) Prior Publication Data

US 2018/0204939 A1 Jul. 19, 2018

(51) Int. Cl.
| | |
|---|---|
| *H01L 29/06* | (2006.01) |
| *H01L 29/775* | (2006.01) |
| *H01L 29/78* | (2006.01) |
| *H01L 29/08* | (2006.01) |
| *H01L 29/12* | (2006.01) |
| *H01L 29/165* | (2006.01) |
| *H01L 29/66* | (2006.01) |
| *H01L 21/265* | (2006.01) |
| *H01L 21/306* | (2006.01) |

(52) U.S. Cl.
CPC ...... *H01L 29/775* (2013.01); *H01L 21/26513* (2013.01); *H01L 21/30604* (2013.01); *H01L 29/0673* (2013.01); *H01L 29/0847* (2013.01); *H01L 29/125* (2013.01); *H01L 29/165* (2013.01); *H01L 29/66439* (2013.01); *H01L 29/66636* (2013.01); *H01L 29/7833* (2013.01); *H01L 29/7848* (2013.01)

(58) Field of Classification Search
CPC ...................................................... H01L 29/775
See application file for complete search history.

(56) References Cited

U.S. PATENT DOCUMENTS

| | | | |
|---|---|---|---|
| 7,498,224 B2 | 3/2009 | Chen et al. | |
| 7,683,362 B2* | 3/2010 | Ohta | H01L 21/823807 257/18 |
| 7,928,427 B1* | 4/2011 | Chang | H01L 21/8258 257/24 |
| 2006/0024874 A1* | 2/2006 | Yun | H01L 29/42392 438/197 |
| 2006/0138398 A1* | 6/2006 | Shimamune | H01L 21/02381 257/19 |
| 2006/0202278 A1* | 9/2006 | Shima | H01L 21/823807 257/369 |

(Continued)

*Primary Examiner* — Eugene Lee
(74) *Attorney, Agent, or Firm* — Winston Hsu

(57) ABSTRACT

A semiconductor device includes a substrate including a first semiconductor material, a gate structure formed on the substrate, and a source stressor and a drain stressor formed in the substrate respectively in a recess at two sides of the gate structure. The source stressor and the drain stressor respectively include at least a first quantum wire and at least a second quantum wire formed on the first quantum wire. The first quantum wire includes the first semiconductor material and a second semiconductor material, and a lattice constant of the second semiconductor material is larger than a lattice constant of the first semiconductor material. And the second quantum wire includes the second semiconductor material.

20 Claims, 5 Drawing Sheets

(56) References Cited

U.S. PATENT DOCUMENTS

| | | | |
|---|---|---|---|
| 2006/0216897 A1* | 9/2006 | Lee | B82Y 10/00 438/282 |
| 2010/0207208 A1* | 8/2010 | Bedell | B82Y 10/00 257/346 |
| 2011/0062417 A1* | 3/2011 | Iwayama | B82Y 10/00 257/24 |
| 2012/0161105 A1* | 6/2012 | Rachmady | B82Y 10/00 257/19 |
| 2013/0341704 A1* | 12/2013 | Rachmady | H01L 29/66545 257/327 |
| 2017/0025314 A1* | 1/2017 | Witters | B82Y 10/00 |
| 2017/0110327 A1* | 4/2017 | Kim | H01L 21/3065 |

* cited by examiner

SEMICONDUCTOR DEVICE INCLUDING QUANTUM WIRES

BACKGROUND OF THE INVENTION

1. Field of the Invention

The present invention relates to a semiconductor device, and more particularly, to a semiconductor device including stressors for selective strain scheme (SSS).

2. Description of the Prior Art

With semiconductor processes entering the era of the deep submicron meter below 65 nanometer (nm), it has been more and more important to increase the metal-oxide semiconductor (hereinafter abbreviated as MOS) drive current. To improve device performance, strained-silicon technique such as selective epitaxial growth (SEG) method is developed to form epitaxial layers serving as the stressors for MOS device. Because a lattice constant of the epitaxial layers is different from that of silicon, such characteristic is employed to cause alteration to the band structure of the silicon in the channel region. Accordingly, carrier mobility of the channel region is enhanced and thus device performance is improved.

Although the epitaxial stressors efficiently improve device performance, it increase complexity of the semiconductor fabrication and difficulties of process control. For example, though higher Ge concentration in the epitaxial SiGe layer improves device performances, dislocation defects usually occur in the higher Ge concentration and/or thicker epitaxial SiGe layer due to the lattice mismatch between the materials. The dislocation defect unwantedly reduces the strain stress. Therefore, it is getting more and more difficult to design and fabricate semiconductor devices having epitaxial stressors.

SUMMARY OF THE INVENTION

According to an aspect of the present invention, a semiconductor device is provided. The semiconductor device includes a substrate including a first semiconductor material, agate structure formed on the substrate, and a source stressor and a drain stressor formed in the substrate respectively in a recess at two sides of the gate structure. The source stressor and the drain stressor respectively include at least a first quantum wire and at least a second quantum wire formed on the first quantum wire. The first quantum wire includes the first semiconductor material and a second semiconductor material, and a lattice constant of the second semiconductor material is larger than a lattice constant of the first semiconductor material. And the second quantum wire includes the second semiconductor material.

According to the semiconductor device provided by the present invention, the first quantum wire and the second quantum wire of the source stressor and drain stressor provide stresses to the channel region of the semiconductor device. More important, by forming the second quantum wire including 100% second semiconductor material on the first quantum wire, the stress from the second quantum wire is directed to the channel region more efficaciously. Briefly speaking, the source stressor and the drain stressor are able to provide the largest stress and significantly improve device performance of the semiconductor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a semiconductor device provided by a first preferred embodiment of the present invention, wherein FIG. 2 is a schematic drawing illustrating a modification to the present invention.

FIG. 3 is a schematic drawing in a step subsequent to FIG. 1,

FIG. 4 is a schematic drawing in a step subsequent to FIG. 3,

FIG. 5 is a schematic drawing in a step subsequent to FIG. 4,

FIG. 6 is a schematic drawing in a step subsequent to FIG. 5, and

FIG. 7 is a schematic drawing in a step subsequent to FIG. 6.

FIGS. 8-10 are schematic drawings illustrating a semiconductor device provided by a second preferred embodiment of the present invention, wherein FIG. 9 is a schematic drawing in a step subsequent to FIG. 8, and FIG. 10 is a schematic drawing in a step subsequent to FIG. 9.

DETAILED DESCRIPTION

Figure 1:
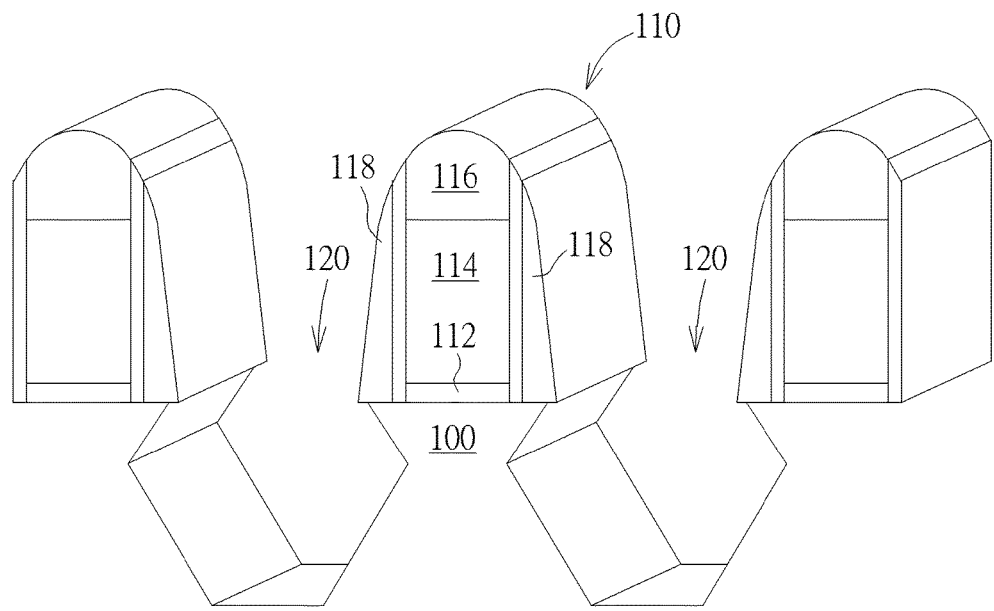

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Please refer to FIGS. 1-7, which are schematic drawings illustrating a semiconductor device provided by a first preferred embodiment of the present invention. Please refer to FIGS. 1 and 2. The preferred embodiment provides a substrate 100. The substrate 100 includes a first semiconductor material, and the first semiconductor material may be, for example but not limited to, silicon (Si), germanium (Ge), III-V compound, or II-VI compound. In some embodiments of the present invention, the first semiconductor material preferably includes Si, but not limited to this. At least a gate structure 110 is formed on the substrate 100. The gate structure 110 respectively includes a gate dielectric layer 112, a gate conductive layer 114 and a cap layer 116 sequentially and upwardly stacked on the substrate 100. It is well-known to those skilled in the art that the cap layer 116 is formed to cover the gate conductive layer 114 and to protect the gate conductive layer 114 from damage that may be caused in any process such as photolithograph process, ion implantation, etching process, or any needed cleaning process in the semiconductor fabricating process. Subsequently, ion implantation is performed to form lightly-doped drains (hereinafter abbreviated as LDDs) (not shown) in the substrate 100 respectively at two sides of the gate structure 110 and followed by forming a spacer 118 on sidewalls of the gate structure 110. The spacer 118 can be a multi-layered structure, but not limited to this. The spacer 118 formed on the sidewalls of the gate structure 110 is used to protect the sidewalls of the gate structure 110 and to define locations for forming a source/drain.

Figure 2:
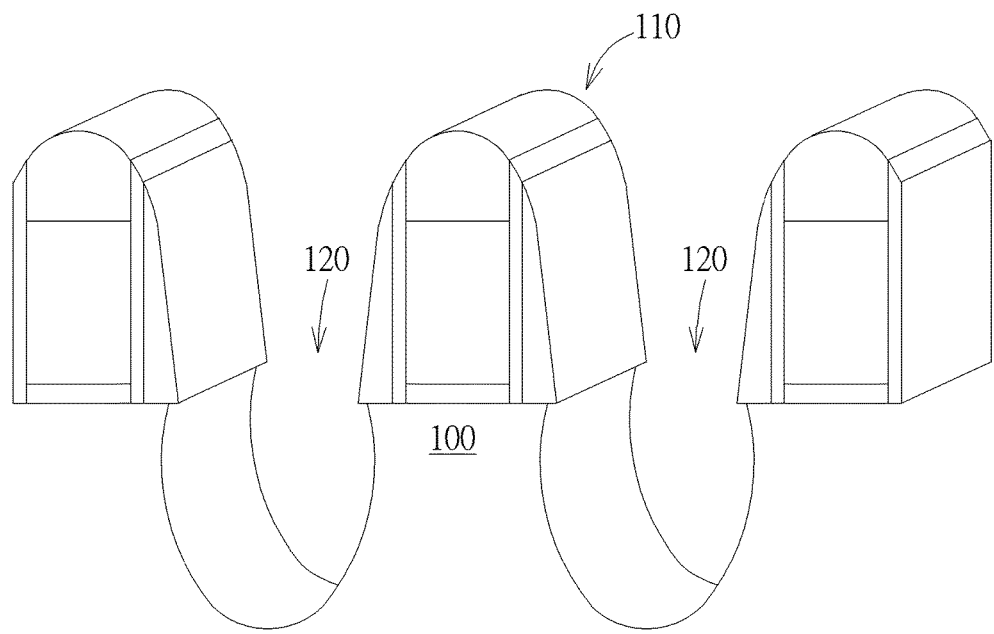

Please still refer to FIGS. 1 and 2. Next, etching process(es) can be performed to form a recess 120 respectively at two sides of the gate structure 110, particularly next to the spacers 118. As shown in FIG. 1, in some embodiments, the recesses 120 can include a diamond shape. As shown in FIG. 2, which is a schematic drawing illustrating a modification to the present invention. According to the modification, the recesses 120 can include a U shape. However, those skilled in the art should easily realize that shape of the recesses 120 is not limited to this. For example, in some embodiments of the present invention, the recesses 120 can include a sigma (Σ) shape, but not limited to this.

Figure 3:
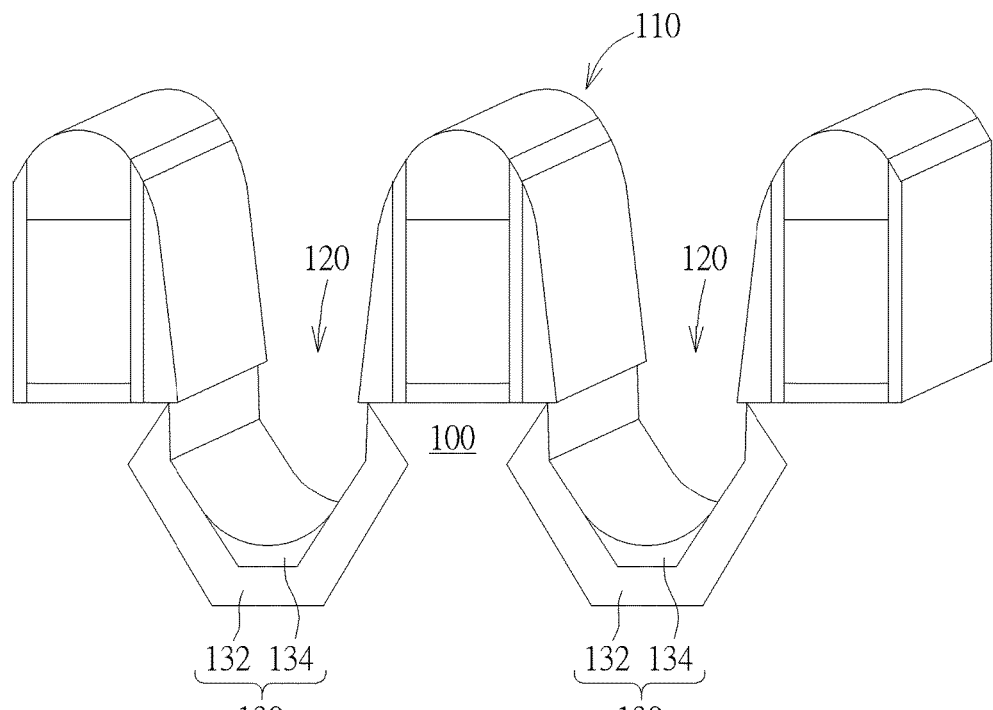

Please refer to FIG. 3. After forming the recesses 120, a buffer layer 130 is formed in the recesses 120, respectively. The buffer layer 130 includes the first semiconductor material, such as Si in accordance with the preferred embodiment. A thickness of the buffer layer 130 can be 15-20 nm, but not limited to this. Furthermore, the buffer layer 130 includes a heavily-doped layer 132 and a lightly-doped layer 134 formed on the heavily-doped layer 132. In some embodiments of the present invention, a concentration of the heavily doped layer 132 can be 2E19, but not limited to this. And a concentration of the lightly-doped layer 134 is smaller than the concentration of the heavily-doped layer 132. As shown in FIG. 3, the heavily-doped layer 132 of the buffer layer 130 covers sidewalls and a bottom of the recesses 120, respectively. And the lightly doped layer 134 covers at least a portion of the heavily-doped layer 132.

Figure 4:
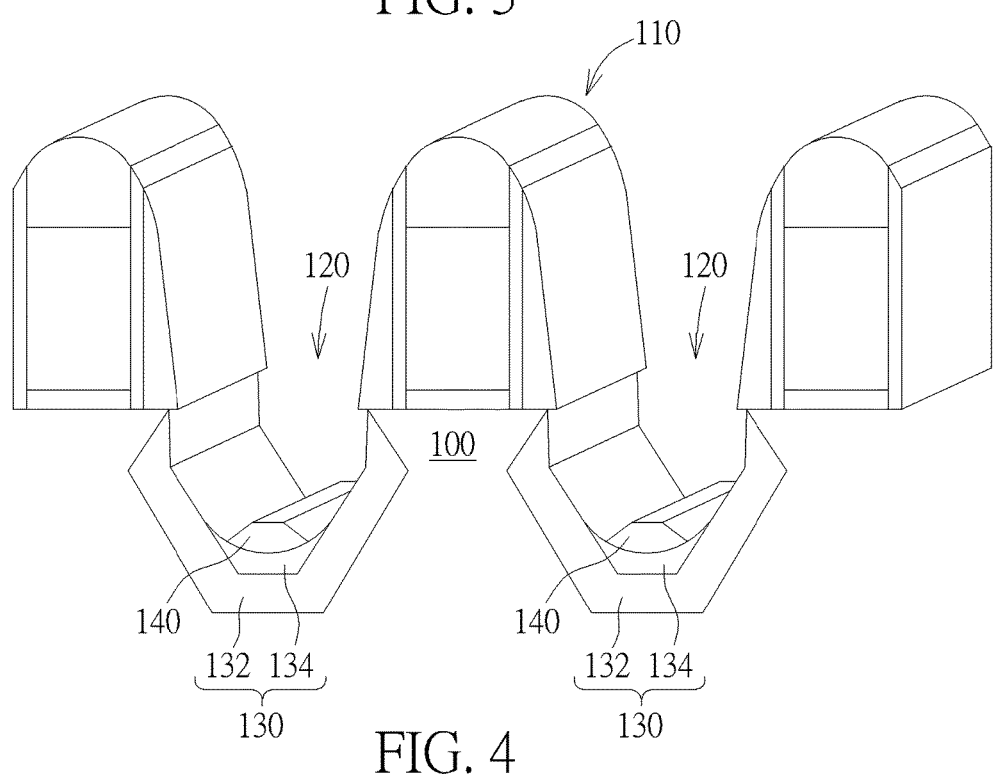

Please refer to FIG. 4. After forming the buffer layer 130, at least a quantum wire 140 is formed on the buffer layer 130 in each recess 120. Therefore, the buffer layer 130 is formed in between the quantum wire 140 and the substrate 100, and the lightly-doped layer 134 is formed in between the heavily-doped layer 132 and the quantum wire 140, as shown in FIG. 4. The quantum wire 140 includes the first semiconductor material and a second semiconductor material, and a lattice constant of the second semiconductor material is larger than a lattice constant of the first semiconductor material. In the preferred embodiment, the first semiconductor material is Si, and the second semiconductor material is germanium (Ge), but not limited to this. Furthermore, the quantum wire 140 can include $Si_{1-x}Ge_x$, and "X" can be 0.6 in the preferred embodiment, but not limited to this. It is noteworthy that the quantum wire 140 is formed by a Stranski-Krastanov (hereinafter abbreviated as SK) growth. In the case of SK growth, a flat $Si_{0.4}Ge_{0.6}$ layer is first formed at the beginning of the growth, which layer can be viewed as a quantum well structure if the growth conditions are so selected that the flat material layer does not exceed a thickness of a few nanometers. As from a given amount of material which is dependent on the material, the substrate and the ambient conditions in the growth, the growth then changes over to protrusion growth due to a comparatively high lattice mismatch between Si-layer and $Si_{0.4}Ge_{0.6}$ layer. Consequently, the $Si_{0.4}Ge_{0.6}$ layer changes to form a stick-like or wire-like protrusion on the buffer layer 130 and is referred to as the quantum wire 140 as shown in FIG. 4. In some embodiments of the preferred embodiment, a width of the quantum wire 140 is smaller than 40 nm, and a height of the quantum wire 140 is smaller than 2.5 nm, but not limited to this.

Figure 5:
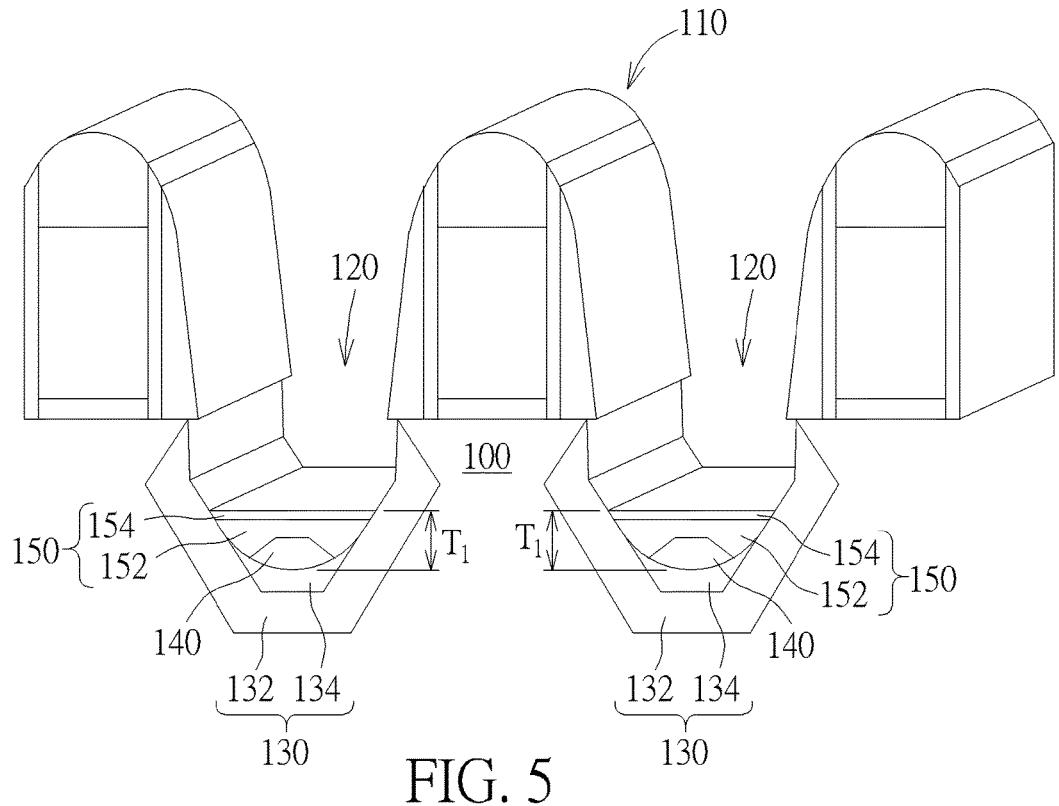

Please refer to FIG. 5. After forming the quantum wire 140, a buffer layer 150 is formed to cover the quantum wire 140. The buffer layer 150 includes the first semiconductor material, that is Si in the preferred embodiment. As shown in FIG. 5, a thickness $T_1$ of the buffer layer 150 is defined from a bottom of the quantum wire 140 to a top surface of the buffer layer 150. And the thickness $T_1$ of the buffer layer 150 is larger than the height of the quantum wire 140. That is, the buffer layer 150 covers the quantum wire 140 entirely. In some embodiments of the present invention, the thickness $T_1$ of the buffer layer 150 is between 10 nm and 15 nm, but not limited to this. More important, the buffer layer 150 includes a cap layer 152 and a spacer layer 154 formed on the cap layer 152. In detail, the cap layer 152 is a low-temperature layer including the first semiconductor material that completely covers the quantum wire 140 while the spacer layer 154 is a high-temperature layer including the first semiconductor material formed on the cap layer 152. The low-temperature layer is referred to as a layer formed at a temperature lower than 450° C. and the high-temperature layer is referred to as a layer formed at a temperature not lower than 670° C. The cap layer 152 is formed to protect and to hold the quantum wire 140. And the spacer layer 154, which is formed at a relatively high temperature, provides a superior intersurface for the layer subsequently to be formed.

Figure 6:
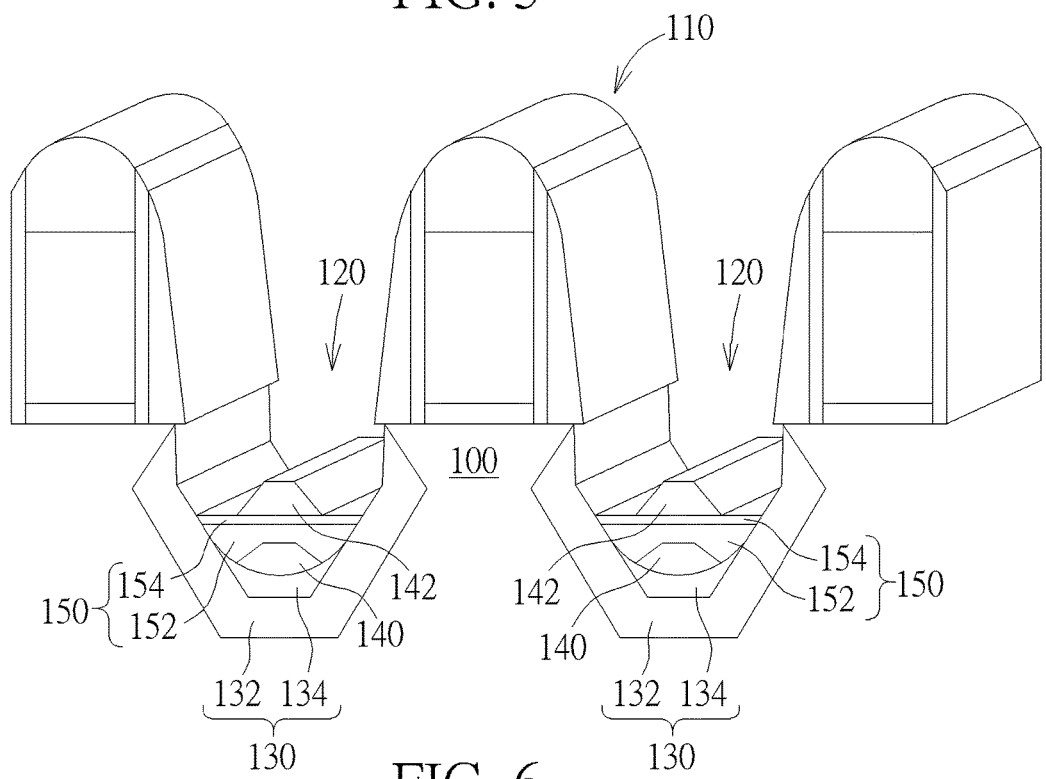

Please refer to FIG. 6. After forming the buffer layer 150, at least a quantum wire 142 is formed on the buffer layer 150 and the quantum wire 140 in each recess 120. Therefore, the buffer layer 150 is formed in between the quantum wire 140 and the quantum wire 142 as shown in FIG. 6. Specifically, the spacer layer 154 of the buffer layer 150 is formed in between the quantum wire 140 and the quantum wire 142, and the cap layer 152 of the buffer layer 150 is formed in between the spacer layer 154 and the quantum wire 140. The quantum wire 142 includes at least the second semiconductor material, that is Ge in the preferred embodiment. Furthermore, the quantum wire 142 can also include the first semiconductor material in the preferred embodiment. More important, a concentration of the second semiconductor material in the quantum wire 142 is larger than a concentration of the second semiconductor material in the quantum wire 140. For example but not limited to, the quantum wire 142 can include $Si_{1-y}Ge_y$, and "Y" can be larger than 0.7 in the preferred embodiment, but not limited to this. It is noteworthy that the quantum wire 142 is also formed by SK growth. As mentioned above, a flat $Si_{0.3}Ge_{0.7}$ layer is first formed at the beginning of the growth, which layer can be viewed as a quantum well structure if the growth conditions are so selected that the flat material layer does not exceed a thickness of a few nanometers. As from a given amount of material which is dependent on the material, the substrate and the ambient conditions in the growth, the growth then changes over to protrusion growth due to a comparatively high lattice mismatch between Si-layer and $Si_{0.3}Ge_{0.7}$ layer. Consequently, the $Si_{0.3}Ge_{0.7}$ layer changes to form a stick-like or wire-like protrusion on the buffer layer 150 and is referred to as the quantum wire 142 as shown in FIG. 6. Because the concentration of the second semiconductor material in the quantum wire 142 is larger than that in the quantum wire 140, a height of the quantum wire 142 is larger than the height of the quantum wire 140, and a width of the quantum wire 142 is smaller than the width of the quantum wire 140. In some embodiments of the present invention, the width of the quantum wire 142 is smaller than 37 nm, and a height of the quantum wire 142 is smaller than 2.7 nm, but not limited to this. Furthermore, in some embodiments of the present invention, the quantum wire 142 formed on the quantum wire 140 can include only the second semiconductor material. In other words, the quantum wire 142 can be a pure Ge wire. Accordingly, the width of the quantum wire 142 is smaller than 35 nm, and the height of the quantum wire 142 is not smaller than 3 nm, but not limited to this.

Figure 7:
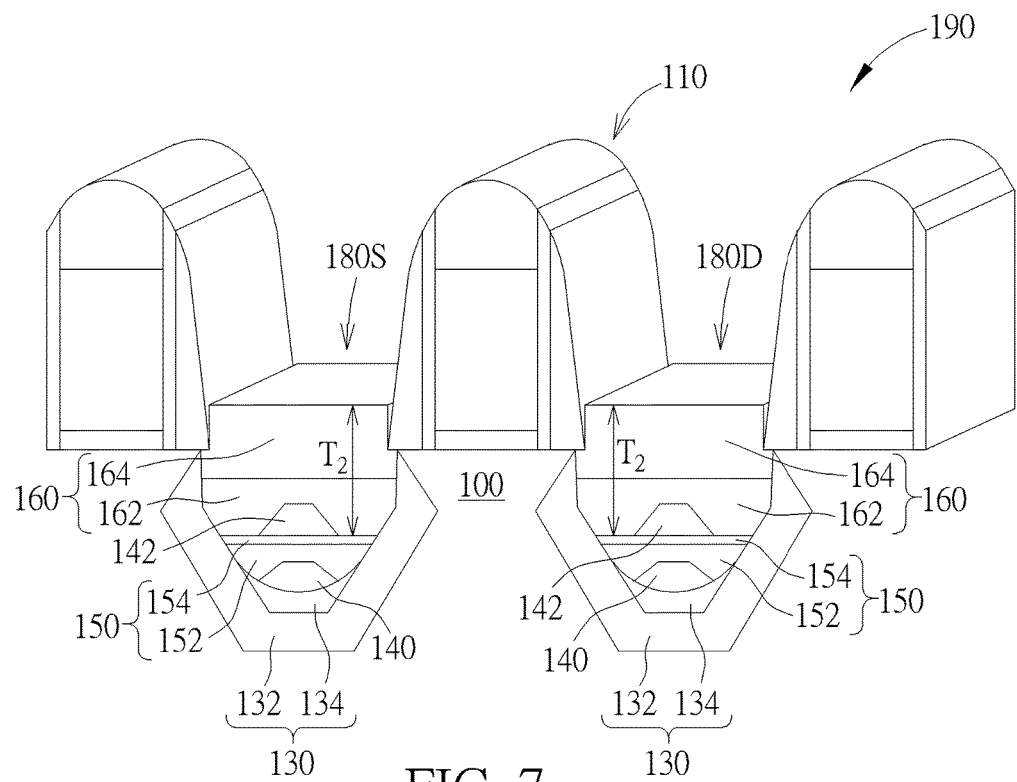

Please refer to FIG. 7. After forming the quantum wire 142, a buffer layer 160 is formed to cover the quantum wire 142. The buffer layer 160 includes the first semiconductor material, that is Si in the preferred embodiment. As shown in FIG. 7, a thickness $T_2$ of the buffer layer 160 is defined from a bottom of the quantum wire 142 to a top surface of the buffer layer 160. And the thickness $T_2$ of the buffer layer 160 is larger than the height of the quantum wire 142. That is, the buffer layer 160 covers the quantum wire 142 entirely. In some embodiments of the present invention the thickness of the buffer layer 160 is larger than 27 nm, but not limited to this. More important, the buffer layer 160 includes a cap layer 162 and a spacer layer 164 formed on the cap layer 162. In other words, the cap layer 162 is formed in between the spacer layer 164 and the quantum wire 142. In detail, the cap layer 162 is a low-temperature layer including the first semiconductor material that completely covers the quantum wire 142 while the spacer layer 164 is a high-temperature layer including the first semiconductor material formed on the cap layer 162. As mentioned above, the low-temperature layer is referred to as a layer formed at a temperature lower than 450° C. and the high-temperature layer is referred to as a layer formed at a temperature not lower than 670° C. The cap layer 162 is formed to protect and to hold the quantum wire 142. And the spacer layer 164, which is formed at a relatively high temperature, provides a superior intersurface for the layer subsequently to be formed. In some embodiments of the present invention, the spacer layer 164 can be a doped layer, and a concentration of the doped layer is about 2E20, but not limited to this.

Accordingly, a source stressor 180S and a drain stressor 180D are formed in the substrate 100 respectively in the recess 120 at two sides of the gate structure 110. And the source stressor 180S and the drain stressor 180D respectively include at least the quantum wire 140 and the quantum wire 142 that providing stresses to the channel region of the semiconductor device 190. Briefly speaking, the source stressor 180S and the drain stressor 180D are able to provide larger stress, and thus device performance of the semiconductor device 190 is improved. More important, since the stresses are generated from the stick-like or wire-like structures, that are the quantum wires 140 and 142, mismatch between the SiGe quantum wires 140/142 and the Si substrate 100 is avoided, and thus dislocation defect is eliminated.

Figure 8:
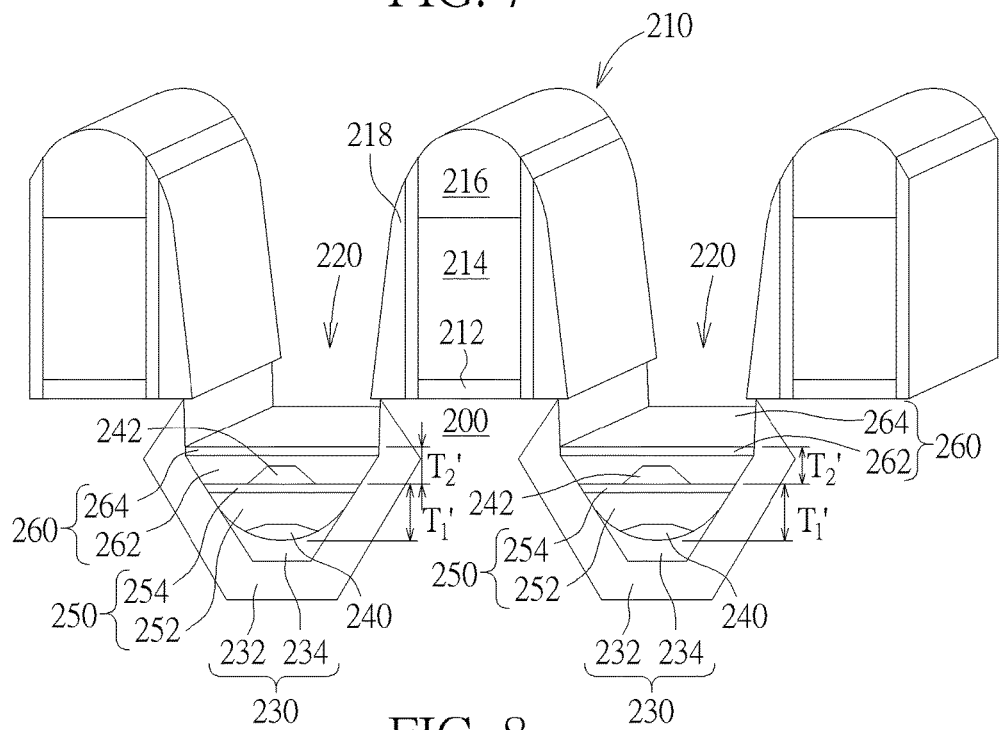
Figure 9:
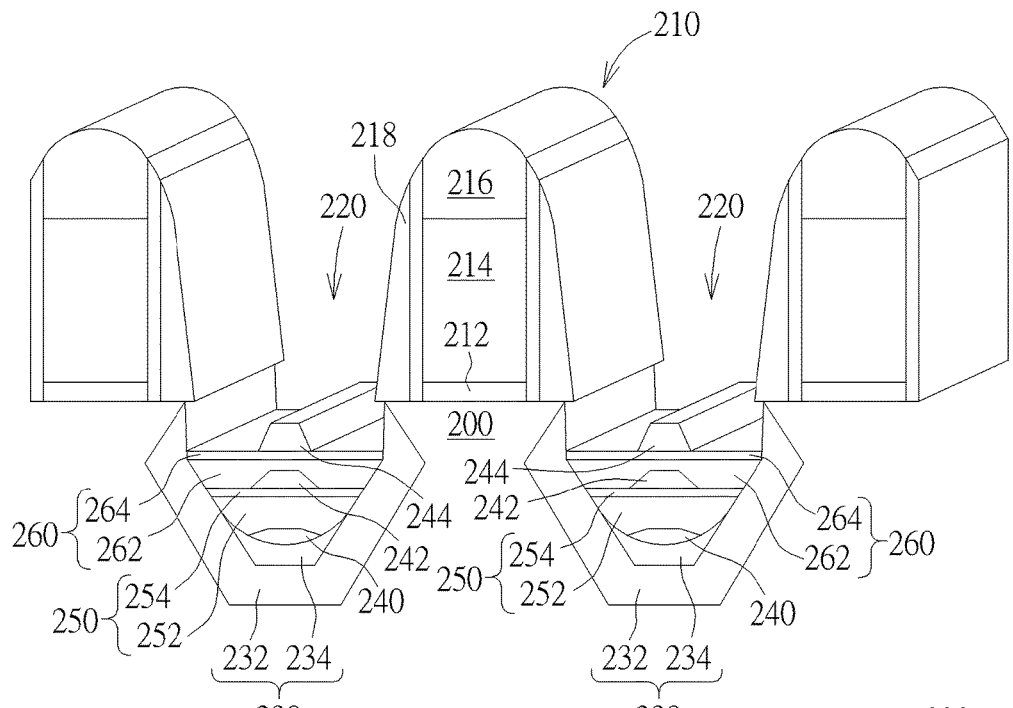
Figure 10:
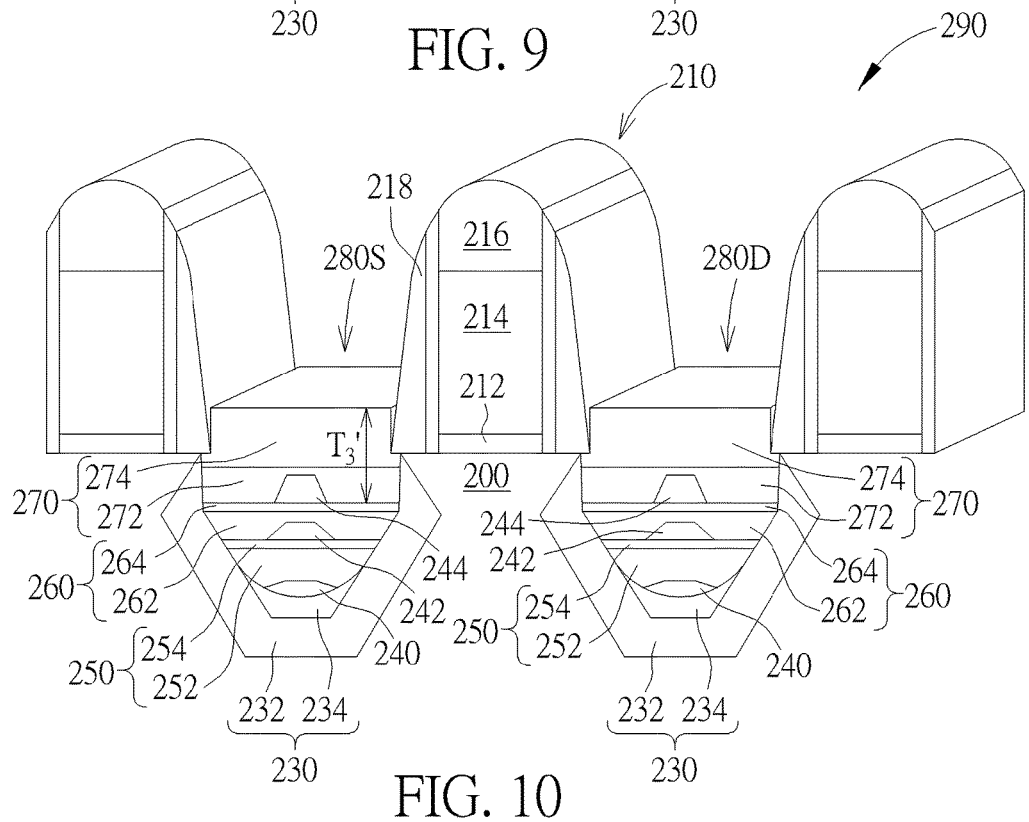

Please refer to FIGS. 8-10, which are schematic drawings illustrating a semiconductor device provided by a second preferred embodiment of the present invention. It is noteworthy that elements the same in the first and second preferred embodiments can include the same material(s), and thus those details are omitted in the interest of brevity. Please refer to FIG. 8. The preferred embodiment provides a substrate 200. The substrate 200 includes a first semiconductor material, and in the preferred embodiment, the first semiconductor material preferably includes Si, but not limited to this. At least a gate structure 210 is formed on the substrate 200. The gate structure 210 respectively includes a gate dielectric layer 212, a gate conductive layer 214 and a cap layer 216 sequentially and upwardly stacked on the substrate 200. Subsequently, ion implantation is performed to form LDDs (not shown) in the substrate 200 respectively at two sides of the gate structure 210 and followed by forming a spacer 218 on sidewalls of the gate structure 210. The spacer 218 can be a multi-layered structure, but not limited to this.

Please still refer to FIG. 8. Next, etching process(es) can be performed to form a recess 220 respectively at two sides of the gate structure 210, particularly next to the spacers 218. As shown in FIG. 8, in some embodiments, the recesses 220 can include a diamond shape. Also as shown in FIG. 2, which is a schematic drawing illustrating a modification to the present invention, the recesses 220 can include a U shape. However, those skilled in the art should easily realize that shape of the recesses 220 is not limited to this. For example, in some embodiments of the present invention, the recesses 220 can include a sigma (Σ) shape, but not limited to this.

Please still refer to FIG. 8. After forming the recesses 220, a buffer layer 230 is formed in the recesses 220, respectively. The buffer layer 230 includes the first semiconductor material, such as Si in accordance with the preferred embodiment. A thickness of the buffer layer 230 can be 15-20 nm, but not limited to this. Furthermore, the buffer layer 230 includes a heavily-doped layer 232 and a lightly-doped layer 234 formed on the heavily-doped layer 232. In some embodiments of the present invention, a concentration of the heavily doped layer 232 can be 2E19, but not limited to this. And a concentration of the lightly-doped layer 234 is smaller than the concentration of the heavily-doped layer 232. As shown in FIG. 8, the heavily-doped layer 232 of the buffer layer 230 covers sidewalls and a bottom of the recess, respectively. And the lightly doped layer 234 covers at least a portion of the heavily-doped layer 232.

Please refer to FIG. 8. After forming the buffer layer 230, at least a quantum wire 240 is formed on the buffer layer 230 in each recess 220. Therefore, the buffer layer 230 is formed in between the quantum wire 240 and the substrate 200, and the lightly-doped layer 234 is formed in between the heavily-doped layer 232 and the quantum wire 240, as shown in FIG. 8. The quantum wire 240 includes the first semiconductor material and a second semiconductor material, and a lattice constant of the second semiconductor material is larger than a lattice constant of the first semiconductor material. In the preferred embodiment, the first semiconductor material is Si, and the second semiconductor material is Ge, but not limited to this. Furthermore, the quantum wire 240 can include $Si_{1-X}Ge_X$, and "X" can be 0.6 in the preferred embodiment, but not limited to this. It is noteworthy that the quantum wire 240 is formed by SK growth. Therefore, the stick-like or wire-like protrusion on the buffer layer 230 is referred to as the quantum wire 240 as shown in FIG. 8. In some embodiments of the preferred embodiment, a width of the quantum wire 240 is smaller than 40 nm, and a height of the quantum wire 240 is smaller than 2.5 nm, but not limited to this.

Please refer to FIG. 8. After forming the quantum wire 240, a buffer layer 250 is formed to cover the quantum wire 240. The buffer layer 250 includes the first semiconductor material, that is Si in the preferred embodiment. As shown in FIG. 8, a thickness $T_1'$ of the buffer layer 250 is defined from a bottom of the quantum wire 240 to a top surface of the buffer layer 250. And the thickness $T_1'$ of the buffer layer 250 is larger than a height of the quantum wire 240. That is, the buffer layer 250 covers the quantum wire 240 entirely. In some embodiments of the present invention the thickness $T_1'$ of the buffer layer 250 is between 10 nm and 15 nm, but not limited to this. More important, the buffer layer 250 includes a cap layer 252 and a spacer layer 254 formed on the cap layer 252. In other words, the cap layer 252 is formed in between the spacer layer 254 and the quantum wire 240. In detail, the cap layer 252 is a low-temperature layer including the first semiconductor material that completely covers the quantum wire 240 while the spacer layer 254 is a high-temperature layer including the first semiconductor material formed on the cap layer 252. The low-temperature layer is referred to as a layer formed at a temperature lower than 450° C. and the high-temperature layer is referred to as a layer formed at a temperature not lower than 670° C. The cap layer 252 is formed to protect and hold the quantum wire 240. And the spacer layer 254, which is formed at a relatively high temperature, provides a superior intersurface for the layer next to be formed.

Please refer to FIG. 8. After forming the buffer layer 250, at least a quantum wire 242 is formed on the buffer layer 250 and the quantum wire 240 in each recess 220. Therefore, the buffer layer 250 is formed in between the quantum wire 240 and the quantum wire 242 as shown in FIG. 8. The quantum wire 242 includes the first semiconductor material and the second semiconductor material in the preferred embodiment. More important, a concentration of the second semiconductor material in the quantum wire 242 is larger than a concentration of the second semiconductor material in the quantum wire 240. For example but not limited to, the quantum wire 242 can include $Si_{1-Y}Ge_Y$, and "Y" is about 0.7 in the preferred embodiment. It is noteworthy that the quantum wire 242 is also formed by SK growth, therefore the stick-like or wire-like protrusion on the buffer layer 250 is referred to as the quantum wire 242 as shown in FIG. 8. Because the concentration of the second semiconductor material in the quantum wire 242 is larger than that in the quantum wire 240, a height of the quantum wire 242 is larger than the height of the quantum wire 240, and a width of the quantum wire 242 is smaller than the width of the quantum wire 240. In some embodiments of the present invention, a width of the quantum wire 242 is smaller than 37 nm, and a height of the quantum wire 242 is smaller than 2.7 nm, but not limited to this.

Please refer to FIG. 8. After forming the quantum wire 242, a buffer layer 260 is formed to cover the quantum wire 242. The buffer layer 260 includes the first semiconductor material, that is Si in the preferred embodiment. As shown in FIG. 8, a thickness $T_2'$ of the buffer layer 260 is defined from a bottom of the quantum wire 242 to a top surface of the buffer layer 260. And the thickness $T_2'$ of the buffer layer 260 is larger than the height of the quantum wire 242. That is, the buffer layer 260 covers the quantum wire 242 entirely. In some embodiments of the present invention the thickness $T_2'$ of the buffer layer 260 is between 10 nm and 15 nm, but not limited to this. More important, the buffer layer 260 includes a cap layer 262 and a spacer layer 264 formed on the cap layer 262. In other words, the cap layer 262 is formed in between the spacer layer 264 and the quantum wire 242. In detail, the cap layer 262 is a low-temperature layer including the first semiconductor material that completely covers the quantum wire 242 while the spacer layer 264 is a high-temperature layer including the first semiconductor material formed on the cap layer 262. As mentioned above, the low-temperature layer is referred to as a layer formed at a temperature lower than 450° C. and the high-temperature layer is referred to as a layer formed at a temperature not lower than 670° C. The cap layer 262 is formed to protect and to hold the quantum wire 242. And the spacer layer 264, which is formed at a relatively high temperature, provides a superior intersurface for the layer subsequently to be formed.

Please refer to FIG. 9. After forming the buffer layer 260, at least a quantum wire 244 is formed on the buffer layer 260 and the quantum wire 242 in each recess 220. Therefore, the buffer layer 260 is formed in between the quantum wire 242 and the quantum wire 244 as shown in FIG. 9. And the quantum wire 242 is formed in between the quantum wire 240 and the quantum wire 244. The quantum wire 244 includes the second semiconductor material in the preferred embodiment. More important, a concentration of the second semiconductor material in the quantum wire 242 is smaller than a concentration of the second semiconductor material in the quantum wire 244. For example but not limited to, the quantum wire 244 can include 100% Ge. It is noteworthy that the quantum wire 244 is also formed by SK growth, therefore the stick-like or wire-like protrusion on the buffer layer 260 is referred to as the quantum wire 244 as shown in FIG. 9. Because the concentration of the second semiconductor material in the quantum wire 244 is larger than that in the quantum wire 242, a height of the quantum wire 244 is larger than the height of the quantum wire 242, and a width of the quantum wire 244 is smaller than the width of the quantum wire 242. In some embodiments of the present invention, the width of the quantum wire 244 is smaller than 35 nm, and a height of the quantum wire 244 is not smaller than 3 nm, but not limited to this.

Please refer to FIG. 10. After forming the quantum wire 244, a buffer layer 270 is formed to cover the quantum wire 244. The buffer layer 270 includes the first semiconductor material, that is Si in the preferred embodiment. As shown in FIG. 10, a thickness $T_3'$ of the buffer layer 270 is defined from a bottom of the quantum wire 244 to a top surface of the buffer layer 270. And the thickness $T_3'$ of the buffer layer 270 is larger than the height of the quantum wire 244. That is, the buffer layer 270 covers the quantum wire 244 entirely.

In some embodiments of the present invention the thickness $T_3'$ of the buffer layer 270 is larger than 27 nm, but not limited to this. More important, the buffer layer 270 includes a cap layer 272 and a spacer layer 274 formed on the cap layer 272. In other words, the cap layer 272 is formed in between the spacer layer 274 and the quantum wire 244. In detail, the cap layer 272 is a low-temperature layer including the first semiconductor material that completely covers the quantum wire 244 while the spacer layer 274 is a high-temperature layer including the first semiconductor material formed on the cap layer 272. As mentioned above, the low-temperature layer is referred to as a layer formed at a temperature lower than 450° C. and the high-temperature layer is referred to as a layer formed at a temperature not lower than 670° C. The cap layer 272 is formed to protect and hold the quantum wire 244. And the spacer layer 274, which is formed at a relatively high temperature, provides a superior intersurface for the layer next to be formed. In some embodiments of the present invention, the spacer layer 274 can be a doped layer, and a concentration of the doped layer is about 2E20, but not limited to this.

Accordingly, a source stressor 280S and a drain stressor 280D are formed in the substrate 200 respectively in the recess 220 at two sides of the gate structure 210. And the source stressor 280S and the drain stressor 280D respectively include at least the quantum wire 240, the quantum wire 242 and the quantum wire 244 that providing stresses to the channel region of the semiconductor device 290. Briefly speaking, the source stressor 280S and the drain stressor 280D are able to provide largest stress, and thus device performance of the semiconductor device 290 is significantly improved. More important, since the stresses are generated from the stick-like or wire-like structures, that are the quantum wires 240/242/244, mismatch between the SiGe or Ge quantum wires 240/242/244 and the Si substrate 200 is avoided, and thus dislocation defect is eliminated. Furthermore, by stacking the quantum wires with upwardly Ge gradient, the pure Ge quantum wire 244, which provide the largest stress, is formed next to the channel region of the semiconductor device 290, and thus the source stressor 280S and the drain stressor 280D are able to provide largest stress and significantly improve device performance of the semiconductor device 290.

According to the semiconductor device provided by the present invention, the quantum wires of the source stressor and drain stressor provide stresses to the channel region of the semiconductor device. More important, by forming the quantum wire including 100% Ge, the stress from the second quantum wire is directed to the channel region more efficaciously. Briefly speaking, the source stressor and the drain stressor are able to provide the largest stress, and thus device performance of the semiconductor device is significantly improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
 a substrate comprising a first semiconductor material;
 a gate structure formed on the substrate; and
 a source stressor and a drain stressor formed in the substrate respectively in a recess at two sides of the gate structure and completely separated from each other, wherein the source stressor and the drain stressor respectively comprising:
 a first buffer layer covering sidewalls and a bottom of the recess;
 at least a first quantum wire protruding from a top surface of the first buffer layer and comprising the first semiconductor material and a second semiconductor material, and a lattice constant of the second semiconductor material being larger than a lattice constant of the first semiconductor material;
 a second buffer layer directly covering the first buffer layer and encompassing the first quantum wire; and
 at least a second quantum wire protruding from a top surface of the second buffer layer, and the second quantum wire comprising the second semiconductor material.

2. The semiconductor device according to claim 1, wherein the first semiconductor material comprises silicon (Si) and the second semiconductor material comprises germanium (Ge).

3. The semiconductor device according to claim 1, wherein the recess comprises a diamond shape or a U shape.

4. The semiconductor device according to claim 1, wherein a height of the second quantum wire is larger than a height of the first quantum wire, and a width of the second quantum wire is smaller than a width of the first quantum wire.

5. The semiconductor device according to claim 1, wherein the first buffer layer formed in between the first quantum wire and the substrate, and the first buffer layer comprises the first semiconductor material.

6. The semiconductor device according to claim 5, wherein the first buffer layer comprises a heavily-doped layer and a lightly-doped layer formed in between the heavily-doped layer and the first quantum wire.

7. The semiconductor device according to claim 6, wherein the heavily-doped layer covers the sidewalls and the bottom of the recess.

8. The semiconductor device according to claim 1, wherein the second buffer layer formed in between the first quantum wire and the second quantum wire, and the second buffer layer comprising the first semiconductor material.

9. The semiconductor device according to claim 8, wherein the second buffer layer comprises a spacer layer formed in between the first quantum wire and the second quantum wire, and a cap layer formed in between the spacer layer and the first quantum wire.

10. The semiconductor device according to claim 8, wherein a thickness of the second buffer layer is larger than a height of the first quantum wire.

11. The semiconductor device according to claim 1, further comprising a top buffer layer formed directly covering the second buffer layer and encompassing the second quantum wire, and the top buffer layer comprising the first semiconductor material.

12. The semiconductor device according to claim 1, further comprising a third quantum wire formed in between the first quantum wire and the second quantum wire, and the third quantum wire comprising the first semiconductor material and the second semiconductor material.

13. The semiconductor device according to claim 12, wherein a concentration of the second semiconductor material in the third quantum wire is smaller than a concentration of the second semiconductor material in the second quantum wire.

14. The semiconductor device according to claim 12, wherein a height of the second quantum wire is larger than a height of the third quantum wire, and the height of the third quantum wire is larger than a height of the first quantum wire.

15. The semiconductor device according to claim 12, wherein a width of the second quantum wire is smaller than a width of the third quantum wire, and the width of the third quantum wire is smaller than a width of the first quantum wire.

16. The semiconductor device according to claim 12, further comprising a first buffer layer formed in between the first quantum wire and the substrate, a second buffer layer formed in between the second quantum wire and the third quantum wire, a third buffer layer formed in between the first quantum wire and the third quantum wire, and the first buffer layer, the second buffer layer and the third buffer layer comprising the first semiconductor material.

17. The semiconductor device according to claim 16, wherein the first buffer layer comprises a heavily-doped layer and a lightly-doped layer formed in between the heavily-doped layer and the first quantum wire.

18. The semiconductor device according to claim 16, wherein the second buffer layer and the third buffer layer respectively comprise a cap layer and a spacer layer formed on the cap layer.

19. The semiconductor device according to claim 16, wherein a thickness of the second buffer layer is larger than a height of the third quantum wire, and a thickness of the third buffer layer is larger than a height of the first quantum wire.

20. The semiconductor device according to claim 12, further comprising a top buffer layer formed on the second quantum wire, and the top buffer layer comprising the first semiconductor material.

* * * * *